(12) United States Patent
Gong et al.

(10) Patent No.: US 11,302,810 B1
(45) Date of Patent: Apr. 12, 2022

(54) FERROELECTRIC FIELD EFFECT TRANSISTOR WITH NANOWIRE CORE

(71) Applicant: International Business Machines Corporation, Armonk, NY (US)

(72) Inventors: Nanbo Gong, White Plains, NY (US); Takashi Ando, Eastchester, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 16/953,505

(22) Filed: Nov. 20, 2020

(51) Int. Cl.
| | |
|---|---|
| *H01L 21/02* | (2006.01) |
| *H01L 21/324* | (2006.01) |
| *H01L 29/06* | (2006.01) |
| *H01L 29/423* | (2006.01) |
| *H01L 29/49* | (2006.01) |
| *H01L 29/51* | (2006.01) |
| *H01L 29/66* | (2006.01) |
| *H01L 29/78* | (2006.01) |
| *H01L 29/786* | (2006.01) |

(52) U.S. Cl.
CPC .. *H01L 29/78391* (2014.09); *H01L 21/02236* (2013.01); *H01L 21/02532* (2013.01); *H01L 21/02603* (2013.01); *H01L 21/3247* (2013.01); *H01L 29/0649* (2013.01); *H01L 29/0673* (2013.01); *H01L 29/42392* (2013.01); *H01L 29/4908* (2013.01); *H01L 29/516* (2013.01); *H01L 29/6684* (2013.01); *H01L 29/66742* (2013.01); *H01L 29/78696* (2013.01)

(58) Field of Classification Search
CPC ......... H01L 29/78391; H01L 21/02236; H01L 21/02532; H01L 21/02603; H01L 21/3247; H01L 29/0649; H01L 29/0673; H01L 29/42392; H01L 29/4908; H01L 29/516; H01L 29/66742; H01L 29/6684; H01L 29/78696
USPC .......................................................... 257/295
See application file for complete search history.

(56) References Cited

U.S. PATENT DOCUMENTS

| | | |
|---|---|---|
| 5,384,729 A | 1/1995 | Sameshima |
| 5,589,845 A | 12/1996 | Yandrofski et al. |
| (Continued) | | |

FOREIGN PATENT DOCUMENTS

| | | |
|---|---|---|
| TW | 201824563 A | 7/2018 |
| WO | 20182363561 W | 12/2018 |

OTHER PUBLICATIONS

Yurchuk et al., "Origin of the endurance degradation in the novel HfO2-based 1T ferroelectric non-volatile memories," International Reliability Physics Symposium, 2014, 2E-5, 5 pp.

(Continued)

*Primary Examiner* — Tong-Ho Kim
(74) *Attorney, Agent, or Firm* — Jeffrey M. Ingalls

(57) ABSTRACT

A ferroelectric field effect transistor (FeFET) is provided. The FeFET includes a buried oxide (BOX) layer; a nanowire layer including pads formed on the BOX layer at source and drain regions of the FeFET, and a nanowire core extending between the pads and over a recess formed in the BOX layer; a metal electrode coating the nanowire core; a ferroelectric layer coating the metal electrode; an interfacial layer coating the ferroelectric layer; and a polysilicon layer formed over a channel region of the FeFET, the polysilicon layer coating the interfacial layer.

20 Claims, 9 Drawing Sheets

(56) References Cited

U.S. PATENT DOCUMENTS

| | | | |
|---|---|---|---|
| 5,753,946 | A | 5/1998 | Naiki |
| 8,362,604 | B2 | 1/2013 | Ionescu |
| 8,536,563 | B2 * | 9/2013 | Bangsaruntip .... H01L 29/78696 257/9 |
| 9,818,848 | B2 | 11/2017 | Sun et al. |
| 9,853,150 | B1 | 12/2017 | Colinge et al. |
| 9,875,784 | B1 | 1/2018 | Li et al. |
| 2004/0361111 | | 2/2004 | Takashi |
| 2010/0140589 | A1 * | 6/2010 | Ionescu .............. H01L 29/7391 257/24 |
| 2011/2911901 | | 12/2011 | Yuan |
| 2015/0171183 | A1 | 6/2015 | Sakai et al. |
| 2017/1627021 | | 6/2017 | Chenming |
| 2020/0989251 | | 3/2020 | Gilbert |
| 2021/0399135 | A1 * | 12/2021 | Polakowski ...... H01L 29/78391 |

OTHER PUBLICATIONS

Chung et al., "First Demonstration of Ge Ferroelectric Nanowire FET as Synaptic Device for Online Learning in Neural Network with High Number of Conductance State and Gmax/Gmin," International Electron Devices Meeting (IEDM), 2018, 15-2, 4 pp.

Gong et al., "A study of endurance issues in HfO2-based ferroelectric field effect transistors: Charge trapping and trap generation," IEEE Electron Device Letters, vol. 39, No. 1, 2018, 4 pages.

Electric Field, Cylindrical Geometry, printed Sep. 2, 2020, Website, 4 pages. http://hyperphysics.phy-astr.gsu.edu/hbase/electric/elecyl.html.

International Search Report and Written Opinion, PCT/EP2021/081629, dated Feb. 14, 2022, 15 pages.

* cited by examiner

FERROELECTRIC FIELD EFFECT TRANSISTOR WITH NANOWIRE CORE

BACKGROUND

The present disclosure relates generally to semiconductor-based electronic devices, and methods of manufacturing semiconductor-based electronic devices. More particularly, the present application relates to ferroelectric-gated field-effect transistor (FeFET) devices including nanowire channels and method for fabrication thereof. Endurance characteristics for FeFET devices may be a function of a large electric field in an interfacial layer (IL) when a polarization in the ferroelectric oxide of the ferroelectric layer is switched. Improving the performance of the ferroelectric layer of FeFET devices may be desirable.

SUMMARY

Embodiments of the present disclosure relate to a ferroelectric field effect transistor (FeFET). The FeFET includes a buried oxide (BOX) layer; a nanowire layer including pads formed on the BOX layer at source and drain regions of the FeFET, and a nanowire core extending between the pads and over a recess formed in the BOX layer; a metal electrode coating the nanowire core; a ferroelectric layer coating the metal electrode; an interfacial layer coating the ferroelectric layer; and a polysilicon layer formed over a channel region of the FeFET, the polysilicon layer coating the interfacial layer.

Other embodiments of the present disclosure relate to a method of fabricating a ferroelectric field effect transistor (FeFET). The method includes forming a buried oxide (BOX) layer. The method includes forming a nanowire layer on the BOX layer, the nanowire layer including pads formed on the BOX layer at source and drain regions of the FeFET, and a nanowire core extending between the pads. The method also includes: undercutting the BOX layer beneath the nanowire core to release the nanowire core from the BOX layer; forming a metal electrode around the nanowire core; forming a ferroelectric layer around the metal electrode; forming an interfacial layer around the ferroelectric layer; and forming a polysilicon layer over a channel region of the FeFET, the polysilicon layer coating the interfacial layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

Figure 1A:
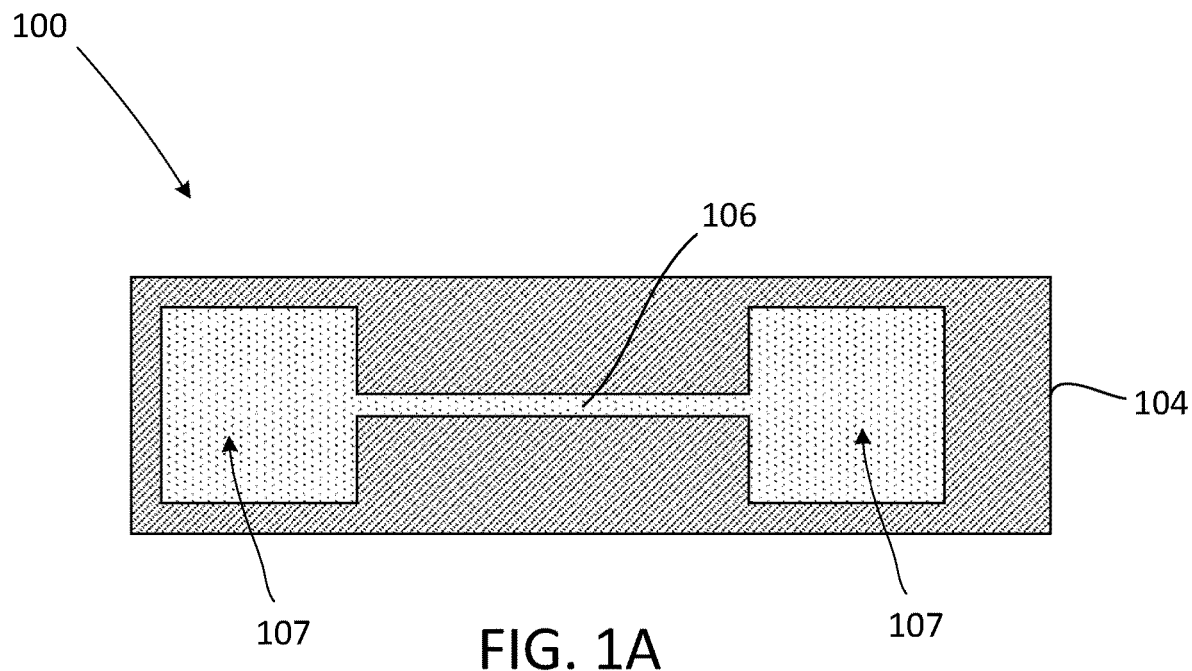
FIGS. 1A and 1B show top-down and cross-sectional views, respectively, of a FeFET device at an intermediate stage of the manufacturing process, according to embodiments.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes semiconductor structures and methods of fabricating semiconductor structures. More particularly, the present application relates to ferroelectric-gated field effect transistors (FeFETs), and methods of manufacturing FeFET devices. In general, a FeFET is a type of field-effect transistor that includes a ferroelectric material sandwiched between the gate electrode and source-drain conduction region of the device. Permanent electrical field polarization in the ferroelectric material causes this type of device to retain the transistor's state (on or off) in the absence of any electrical bias. FeFET transistors may be used in FeFET memory devices, which are a type of single transistor non-volatile memory.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. For a FeFET device, a ferroelectric layer of the device may be used to store information as a "0" or a "1," and an RTA process may be employed to create the ferroelectric film. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

As discussed briefly above, the endurance characteristics for FeFET devices may be a function of a large electric field in an interfacial layer (IL) when a polarization state in the ferroelectric oxide material of the ferroelectric layer is switched. Due to this large electric field, a degradation of the IL may occur earlier than the fatigue of polarization, and this may contribute to the endurance failure of FeFET devices. According the present embodiments, by adjusting (or reducing) the high electric field in the IL based on the geometry of the device, a FeFET device may be able to achieve more robust performance characteristics (e.g., the device is able to achieve an increased number of read/write cycles before an endurance failure). In certain embodiments, the high electric field may be reduced by altering the geometric design of the device, and by placing the interfacial layer at a location where the electric field is not as strong.

In general, an electric field of a conducting cylindrical structure (or a cylindrical shell) is a function of the radius of the cylinder. In particular, the electric field of an infinite cylindrical conductor with a uniform linear charge density can be obtained by applying Gauss' law. Considering a Gaussian surface in the form of a cylinder at radius r>R, the electric field has the same magnitude at every point of the cylinder and is directed outward. Therefore, the electric flux is the electric field multiplied by the area of the cylinder. Moreover, considering that the electric field in a cylindrical structure is a function of the radius, the electric field in an outer portion thereof will be smaller. By adjusting the geometry of the structure of the FeFET devices according the present embodiments by having the interfacial layer positioned outside the ferroelectric layer, the inner ferroelectric layer will experience a relatively large electric field. Also, because the interfacial layer (IL) is formed on the outside of the ferroelectric layer, the IL will experience a relatively small electric field. As mentioned herein, because the degradation of the IL can contribute to the endurance failure of a FeFET device, and because a high electric field may cause degradation of the IL, positioning the IL outside of the ferroelectric layer where it will experience a lesser electric filed may minimize the degradation of the IL and help extend the life of the FeFET device.

The present techniques provide a gate-all-around (GAA) nanowire ferroelectric field-effect transistor (FeFET) as well as methods for fabricating the same. The present methods are described using silicon (Si) nanowires and Si processing. However, the present techniques can also be practiced with other semiconductor materials such as, for example, germanium (Ge) or III-V semiconductors. When non-Si-containing semiconductors are used, the processing steps of the present teachings are generally the same except that growth temperature and dopant species applied are adapted to the specific semiconductor used. Use of Si-containing semiconductor materials such as Si, silicon germanium (SiGe), Si/SiGe, silicon carbide (SiC) or silicon germanium carbide (SiGeC), for example, may be used.

Figure 1B:
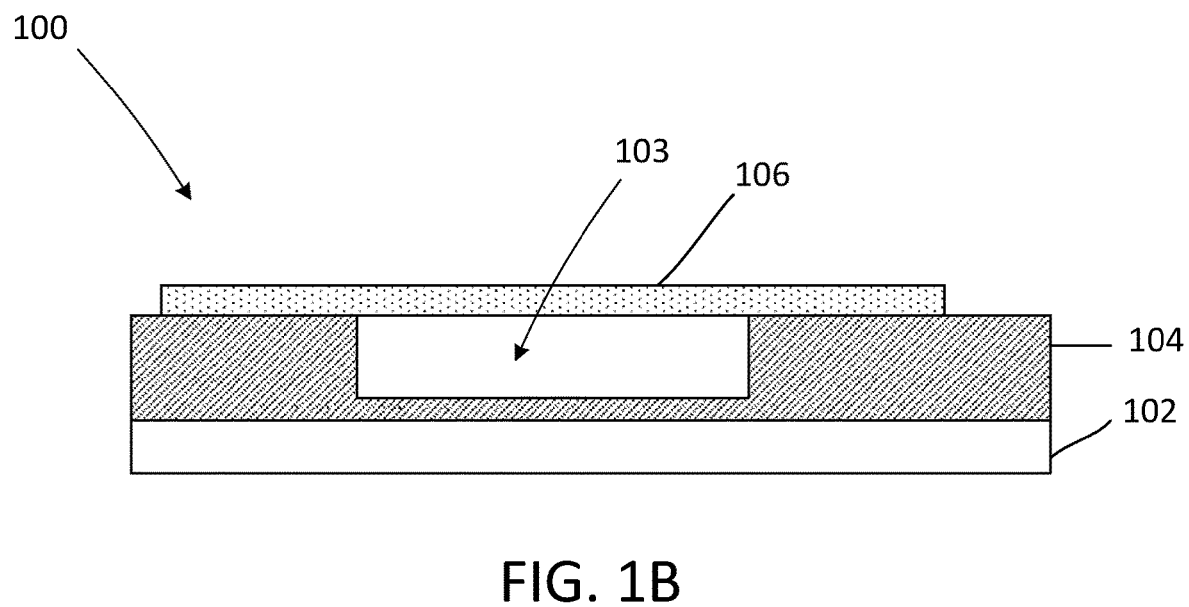

Referring now to the drawings in which like numerals represent the same or similar elements and initially to FIGS. 1A and 1B, a FeFET device 100 is shown including a substrate 102 and buried oxide (BOX) layer 104, according to embodiments. In certain examples, the substrate 102 may be a Si-substrate, although other suitable materials may be used. As shown in the cross-sectional view of FIG. 1B, the buried oxide layer 104 is formed on top of the underlying substrate 102. As shown in FIG. 1B, the nanowire 106 traverses across the recessed portion 103 of the buried oxide layer 104. In certain embodiments, the nanowire 106 may comprise Si or silicide, or any other suitable material. As shown in the top-down view of FIG. 1A, the nanowire 106 may include square pad portions 107 on either side (e.g., a source side on the left, and a drain side on the right) of the BOX layer 104 recessed portion 103. A width dimension of the as-patterned nanowire 106 can be in the range of from about 10 nm to about 30 nm, for example. In certain examples, the patterning of the nanowire 106 may be done by conventional lithography (e.g., optical or e-beam) followed by reactive ion etching (RIE). That is, the nanowire 106 can be suspended (released from the BOX layer 104) by etching the BOX layer 104 and recessing the BOX layer 104 under the nanowire 106 to form the recessed portion 103. The nanowire 106 thus forms a suspended bridge between different sides of the BOX layer 104. Recessing of the BOX layer 104 can be achieved with, for example, a diluted hydrofluoric (DHF) etch. The DHF etch may be an isotropic etch. Thus, the lateral component of the etching undercuts the BOX layer 104 under the narrow nanowire 106.

Figure 6A:
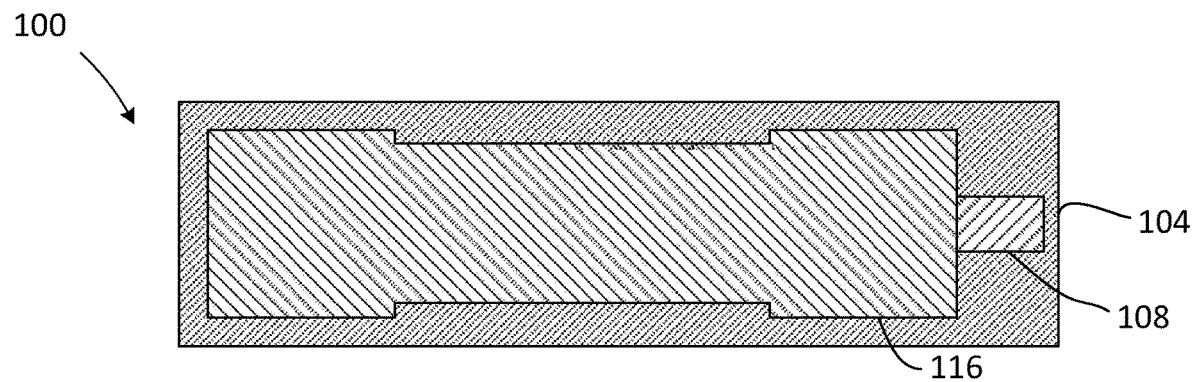
FIGS. 6A, 6B and 6C show top-down, cross-sectional and cross-sectional side views, respectively, of the FeFET device of FIGS. 1A and 1B at a subsequent stage of the manufacturing process, according to embodiments.
Figure 6B:
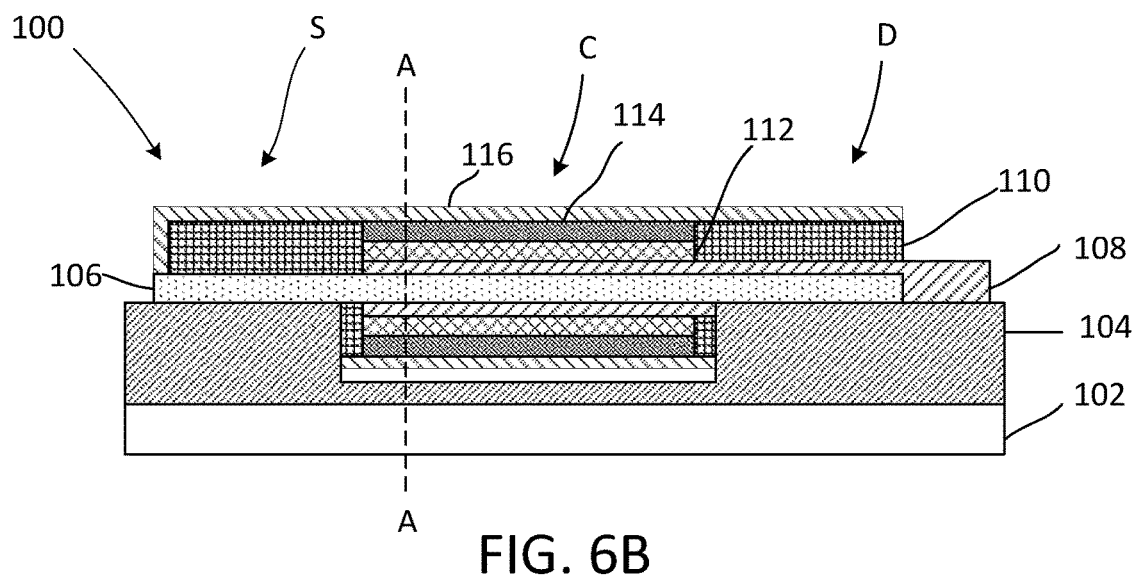
Figure 6C:
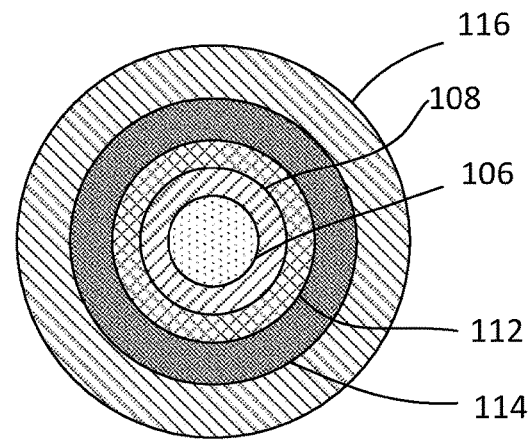

In certain embodiments, the suspended nanowire 106 may be further processed to change the cross-sectional profile of the nanowire 106 from a generally square (or rectangular) shape to a generally circular cross-sectional shape (see also, FIG. 6C). In certain embodiments, a diameter of the suspended portion of the nanowire 106 of the general gate-all-around (GAA) MOSFET structure is about 10 nm or less. In certain embodiments, a process to reliably obtain highly uniform and smooth silicon nanowires in a sub-10 nm range, may include a fabrication technique (while utilizing conventional CMOS processes) of sequential hydrogen annealing followed by high-temperature oxidation. In an example process of producing the nanowire 106, the nanowire 106 is first patterned by standard lithography techniques. Then, a maskless thinning/smoothing of the nanowire 106 may be achieved by a $H_2$ annealing process. The annealing process may change the cross-sectional shape of the suspended portion of the nanowire 106 from a generally square (or rectangular) shape to a generally circular cross-sectional shape (see also, FIG. 6C). In certain embodiments, the diameter of the nanowire 106 may then be further reduced in size by an oxidation process. The oxidation process may further reduce the nanowire dimensions without measurable line edge roughness (LER) degradation.

Figure 2A:
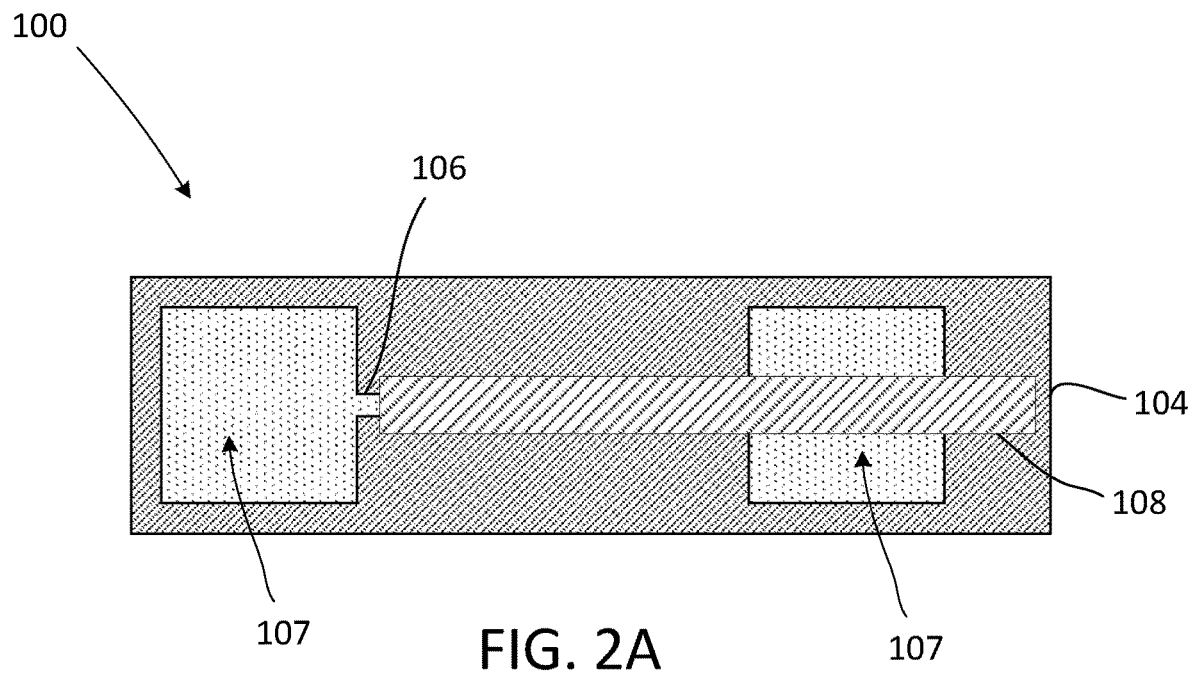
FIGS. 2A and 2B show top-down and cross-sectional views, respectively, of the FeFET device of FIGS. 1A and 1B at a subsequent stage of the manufacturing process, according to embodiments.
Figure 2B:
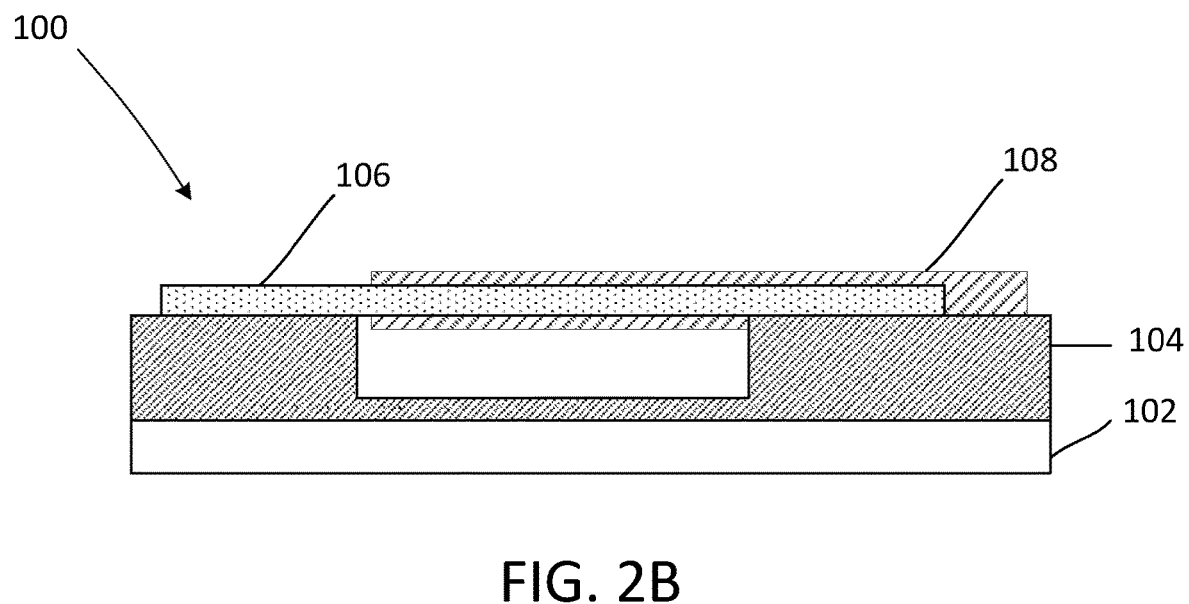

Referring now to FIGS. 2A and 2B, top-down and cross-sectional views, respectively, of the FeFET device 100 of FIGS. 1A and 1B are shown at a subsequent stage in the manufacturing process. As shown in FIGS. 2A and 2B, a metal electrode 108 (e.g., TiN, Ir, TaN, etc.) is deposited to coat the cylindrical portion of the suspended nanowire 106 and is also formed to extend to the right one of the contact pads 107 of the nanowire 106. As shown in FIG. 2B, a thickness of the metal electrode 108 that is coating the suspended portion of the nanowire 106 is selected such that an amount of the recessed portion 103 of the BOX layer 104 still exists. Following the generally cylindrical cross-sectional profile of the suspended portion of the nanowire 106, the suspended portion of the metal electrode 108 also has a generally cylindrical cross-sectional profile (see also, FIG. 6C).

Figure 3A:
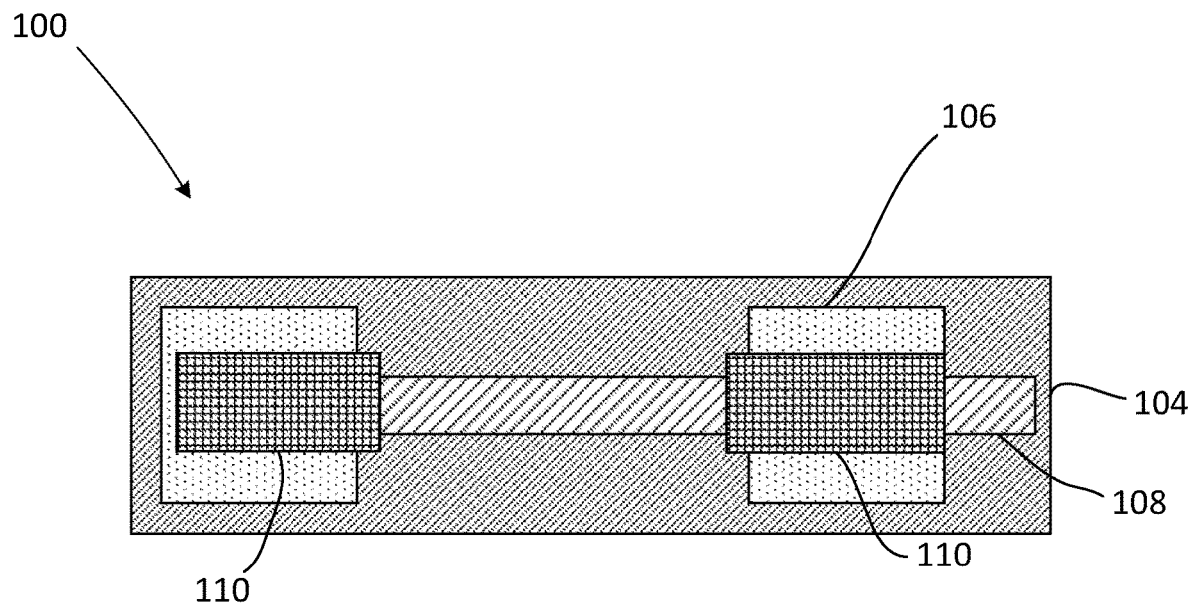
FIGS. 3A and 3B show top-down and cross-sectional views, respectively, of the FeFET device of FIGS. 2A and 2B at a subsequent stage of the manufacturing process, according to embodiments.
Figure 3B:
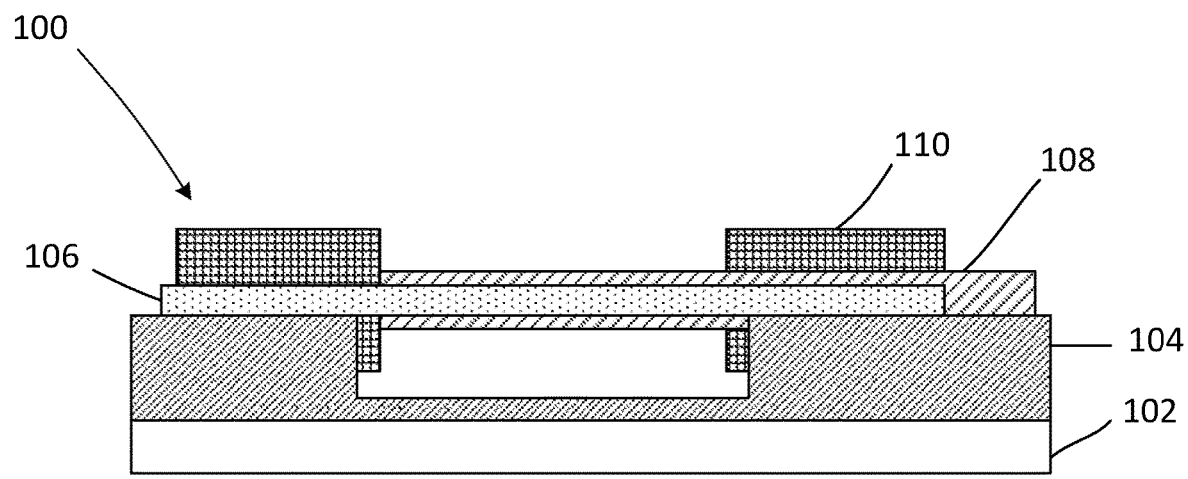

Referring now to FIGS. 3A and 3B, top-down and cross-sectional views, respectively, of the FeFET device 100 of FIGS. 2A and 2B are shown at a subsequent stage in the manufacturing process. As shown in FIGS. 3A and 3B, an insulator oxide layer 110 is formed on the right and left sides (i.e., the source side and the drain side) of the FeFET device 100. The insulator oxide layer 110 can comprise silicon dioxide ($SiO_2$), silicon oxynitride (SiON), hafnium oxide ($HfO_2$) or any other suitable high-κ dielectric(s), and it may be deposited over pads 107 using physical vapor deposition (PVD), chemical vapor deposition (CVD), atomic layer deposition (ALD) or an oxidation furnace in the case of $SiO_2$ and SiON. The insulator oxide layer 110 may also be considered as a type of spacer that allows for separation of the active regions of the FeFET device 100.

Figure 4A:
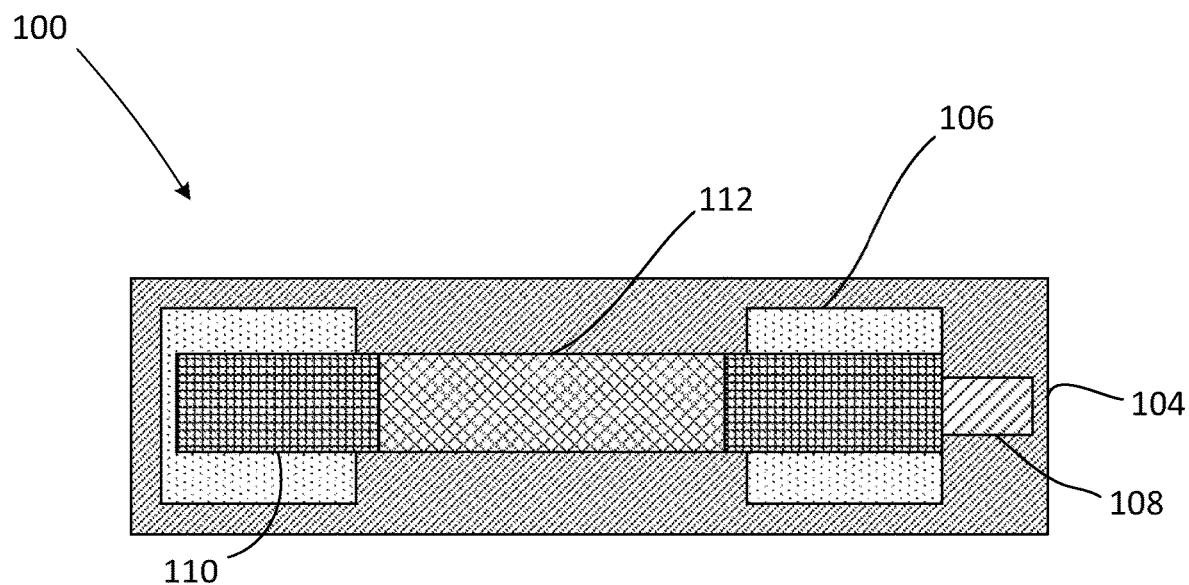
FIGS. 4A and 4B show top-down and cross-sectional views, respectively, of the FeFET device of FIGS. 3A and 3B at a subsequent stage of the manufacturing process, according to embodiments.
Figure 4B:
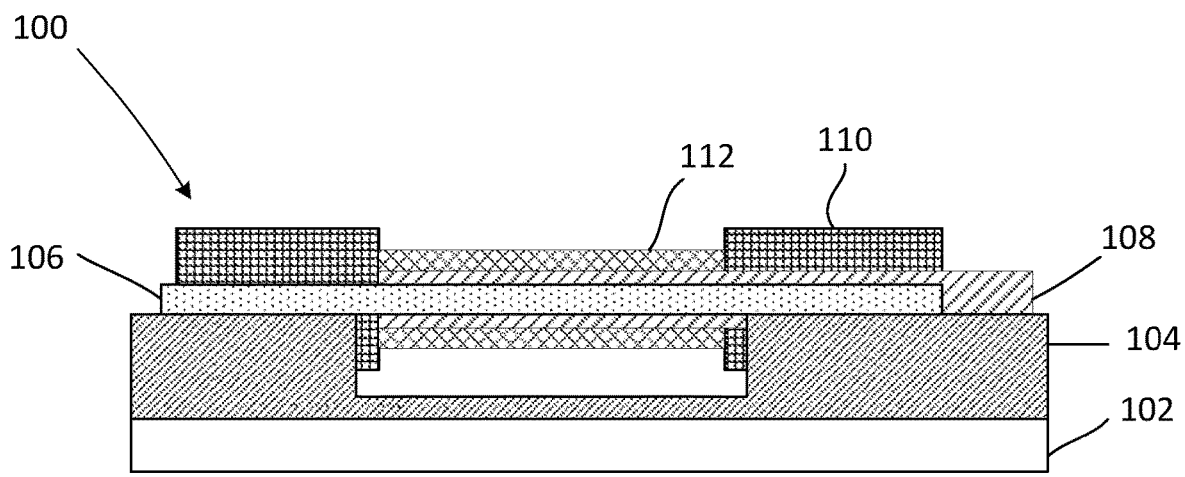

Referring now to FIGS. 4A and 4B, top-down and cross-sectional views, respectively, of the FeFET device 100 of FIGS. 3A and 3B are shown at a subsequent stage in the manufacturing process. As shown in FIGS. 4A and 4B, after the formation of the insulator oxide layer 110, a ferroelectric oxide layer 112 is formed around the metal electrode 108. Following the generally cylindrical cross-sectional profile of the suspended portion of the nanowire 106 and the metal electrode 108, the ferroelectric oxide layer 112 also has a generally cylindrical cross-sectional profile (see also, FIG. 6C). In certain embodiments, the ferroelectric oxide layer 112 may comprise $HfO_2$, for example. The $HfO_2$ may be undoped or doped. Dopants for the $HfO_2$ may include, for example, Si, Al, Zr, La, N, etc. The ferroelectric oxide layer 112 may be formed by atomic layer deposition (ALD) or any other suitable material deposition technique. In certain embodiments, the ferroelectric oxide layer 112 is in an orthorhombic phase and may have a thickness ranging from 1 nm to 30 nm thick, for example.

Figure 5A:
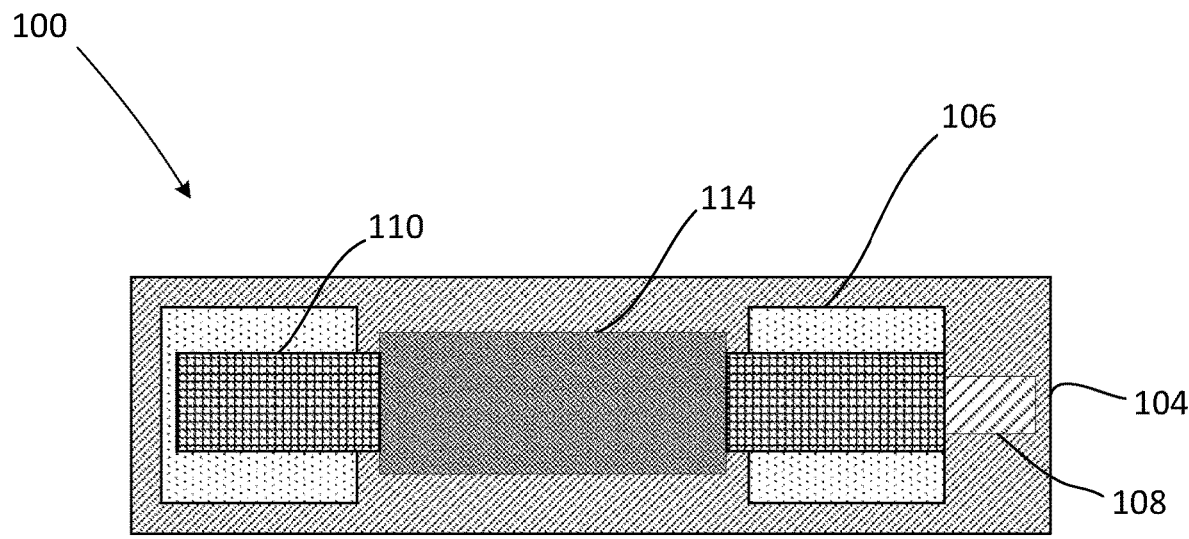
FIGS. 5A and 5B show top-down and cross-sectional views, respectively, of the FeFET device of FIGS. 4A and 4B at a subsequent stage of the manufacturing process, according to embodiments.
Figure 5B:
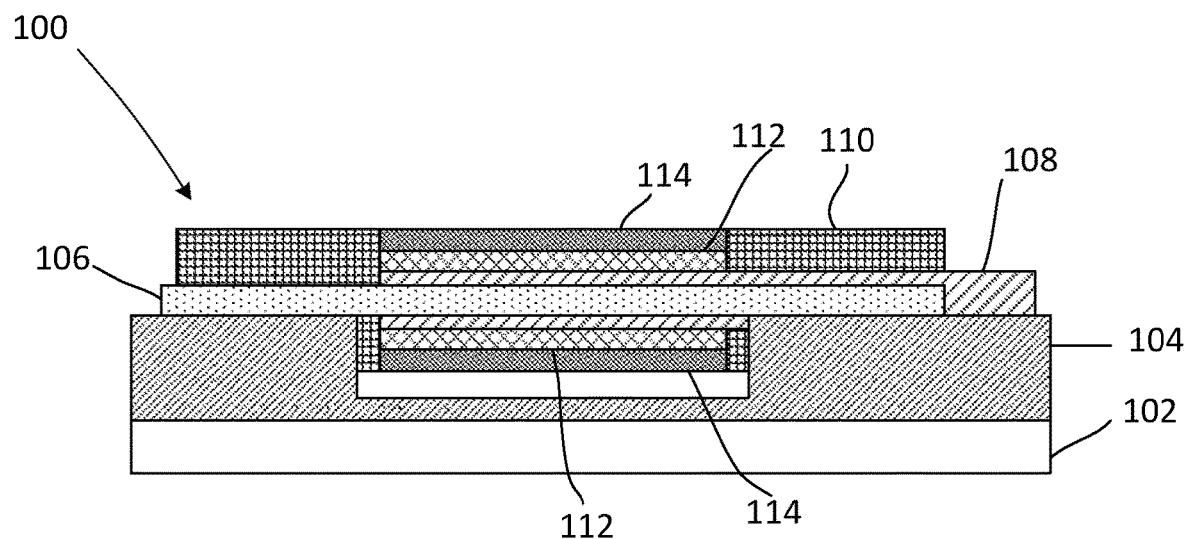

Referring now to FIGS. 5A and 5B, top-down and cross-sectional views, respectively, of the FeFET device 100 of FIGS. 4A and 4B are shown at a subsequent stage in the manufacturing process. As shown in FIGS. 5A and 5B, after the formation of the ferroelectric oxide layer 112, an interfacial layer 114 is formed around the ferroelectric oxide layer 112. Following the generally cylindrical cross-sectional profile of the suspended portion of the nanowire 106, the metal electrode 108 and the ferroelectric oxide layer 112, the now formed interfacial layer 114 also has a generally cylindrical cross-sectional profile (see also, FIG. 6C). The interfacial layer 114 may be formed by atomic layer deposition (ALD) or any other suitable material deposition technique. As described above, the interfacial layer 114 can be a source of degradation for the FeFET device 100 due to normally high levels of electric field being applied thereto. However, in the present embodiments, because the interfacial layer 114 is outside of both the metal electrode 108 and the ferroelectric oxide layer 112, it is positioned at a greater distance from a central axis of the nanowire 106 (i.e., at a greater radius). Thus, the interfacial layer 114 will experience a relatively smaller electric field and may be less prone to electric field degradation. As such, the endurance characteristics of the FeFET device 100 may be improved. In certain embodiments, the interfacial layer 114 may have a thickness ranging from 1 nm to 5 nm thick, for example. The interfacial layer 114 may be comprised of one or more of $SiO_2$, SiON, SiN, etc.

Referring now to FIGS. 6A, 6B and 6C, top-down, cross-sectional and cross-sectional side views, respectively, of the FeFET device 100 of FIGS. 5A and 5B are shown at a subsequent stage in the manufacturing process. As shown in FIGS. 6A and 6B, a polysilicon layer 116 is deposited over the pad portions 107 of the nanowire 106 and around the suspended cylindrical portion of the interfacial layer 114. Thus, the polysilicon layer is deposited to cover a channel region C of the FeFET device 100 that is between the source region S and the drain region, as indicated in FIG. 6B. FIG. 6C is a cross-sectional side view of FIG. 6B taken along the line A-A showing the concentric layering of the nanowire 106, the metal electrode 108, the insulator oxide layer 110, the ferroelectric oxide layer 112, the interfacial layer 114 and the polysilicon layer 116. In certain embodiments, a CMP process may be performed on the FeFET device 100 after formation of the polysilicon layer 116, which may flatten certain upper portions of the polysilicon layer 116 (i.e., as opposed to the perfectly circular cross-sectional depiction of the polysilicon layer 116 shown in FIG. 6C.

Figure 7:
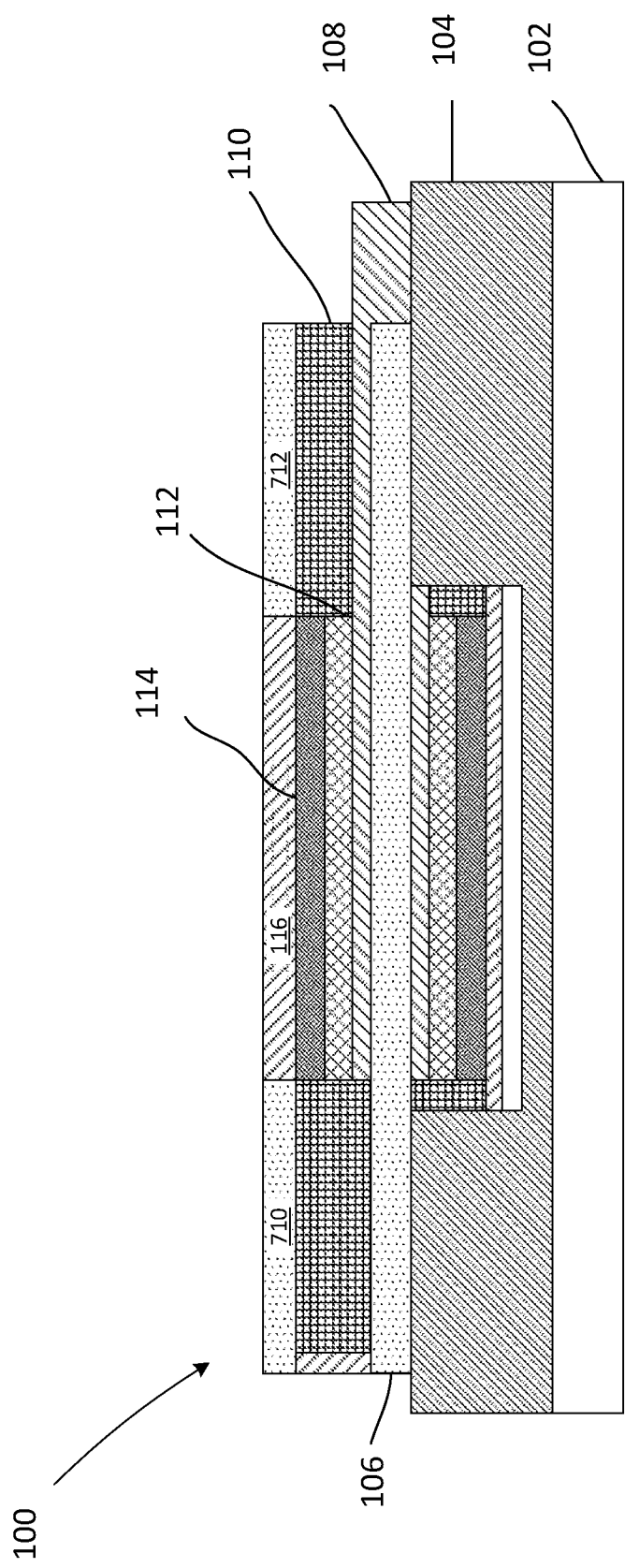
FIG. 7 shows a cross-sectional view of the FeFET device of FIG. 6B at a subsequent stage in the manufacturing process, according to embodiments.

Referring now to new FIG. 7, a cross-sectional view of the FeFET device 100 of FIG. 6B is shown at a subsequent stage in the manufacturing process. As shown in FIG. 7, a source region 710 and a drain region 712 are formed in the polysilicon layer 116. The source region 710 and the drain region 712 are regions where the poly-silicon layer 116 is heavily doped. The doping can be introduced by methods such as ion implantation following by an annealing or dopant diffusion from a doping source. Doped poly-silicon can also be added to the source region 710 and the drain region 712 selectively by various deposition methods.

Figure 8:
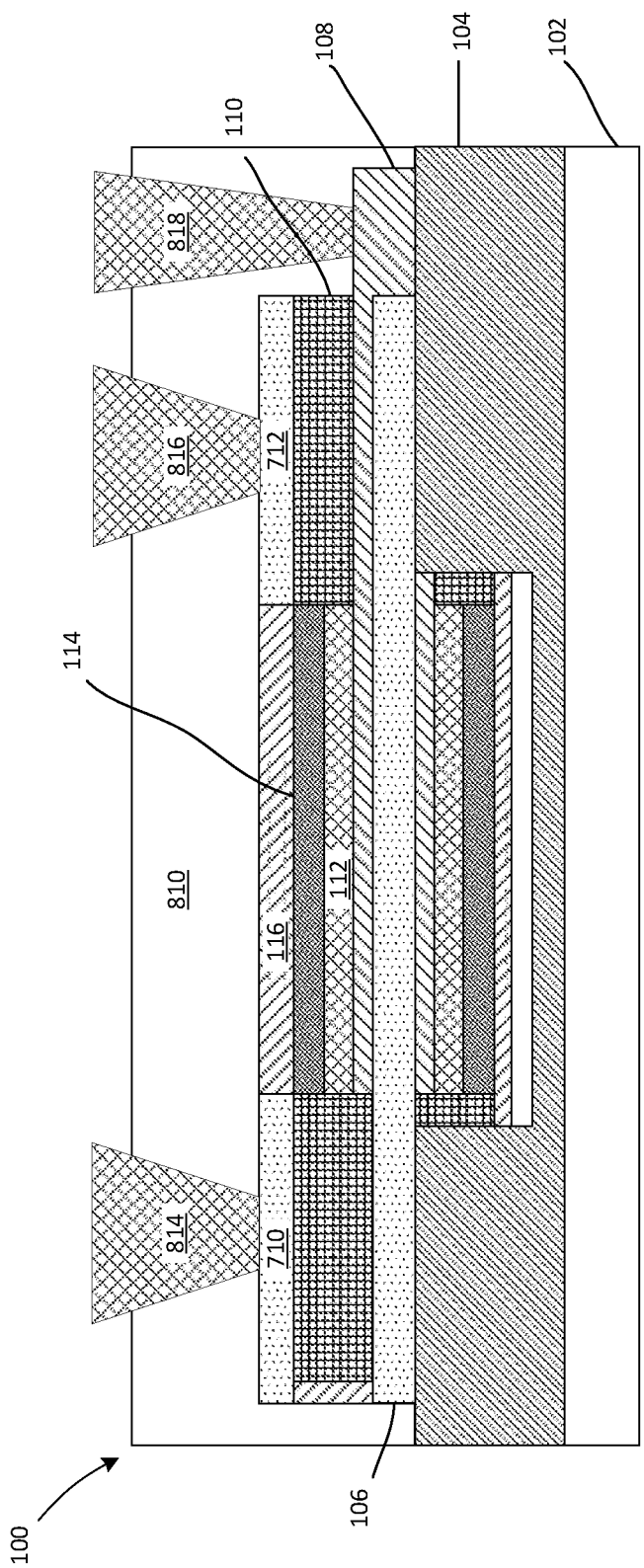
FIG. 8 shows a cross-sectional view of the FeFET device of FIG. 7 at a subsequent stage in the manufacturing process, according to embodiments.

Referring now to new FIG. 8, a cross-sectional view of the FeFET device 100 of FIG. 7 is shown at a subsequent stage in the manufacturing process. As shown in FIG. 8, a dielectric film 810 is deposited over the source region 710, the poly-silicon layer 116 and the drain region 712. Then, vias are opened in the dielectric film 810 to access the source region 710, the drain region 712 and the gate (i.e., the metal electrode 108). Then, a metal such as, for example, tungsten is used to form the source contact 814, drain contact 816 and the gate contact 818.

Figure 9:
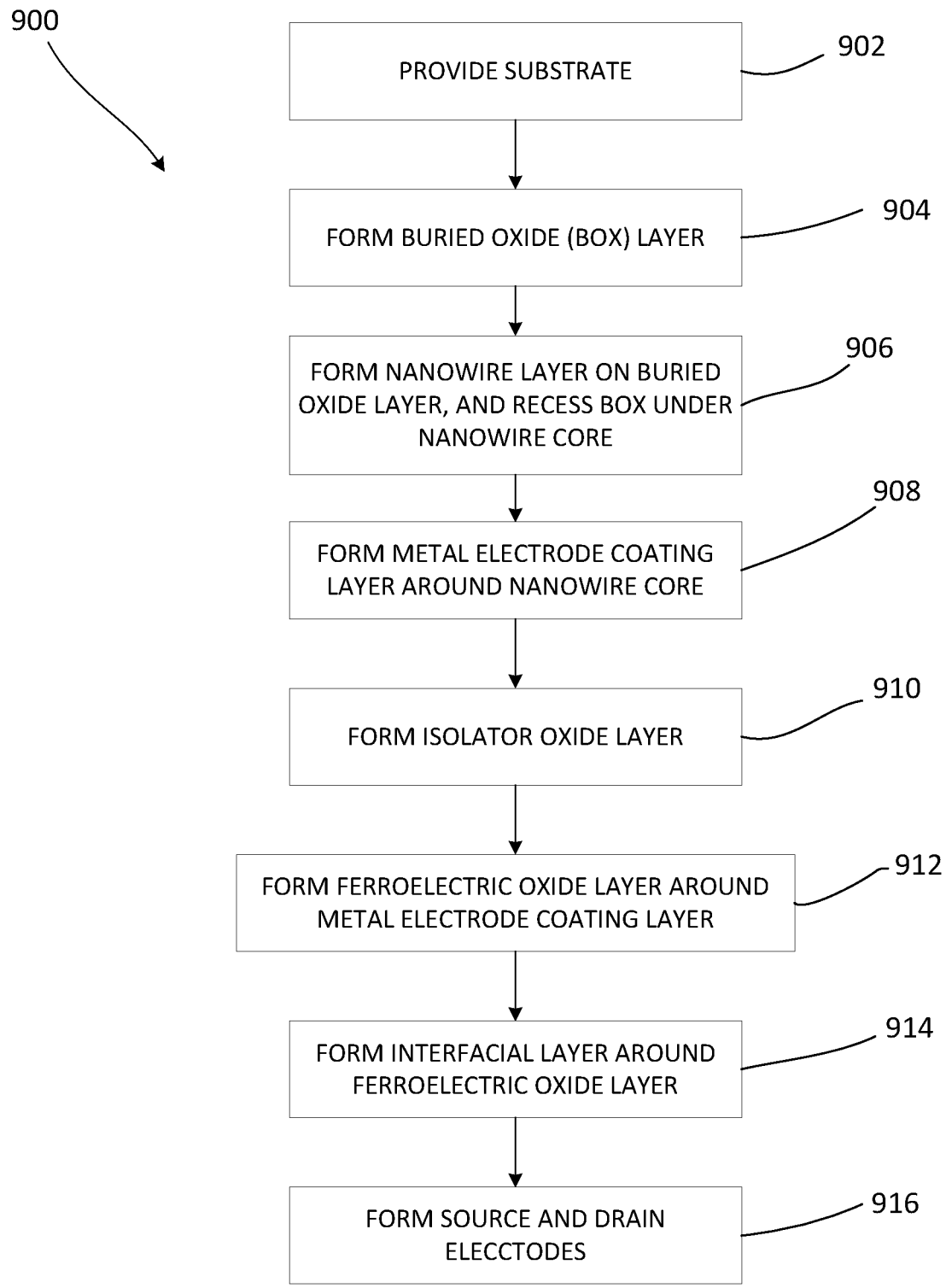
FIG. 9 illustrates a method of manufacturing a FeFET device, according to embodiments.

Referring now to FIG. 9, this figure illustrates a method 900 of manufacturing a FeFET device, according to embodiments. As shown in FIG. 9, a substrate is provided at operation 702. As mentioned above, the substrate may be a silicon substrate or may be comprised of any other suitable material(s). At operation 904, a buried oxide (BOX) layer is formed on the substrate. At operation 906, the nanowire layer is formed. This nanowire layer includes pads on the source and drain region sides of the FeFET device, and a nanowire core connecting the pads. Thus, at least initially, the nanowire layer has a general barbell shape. It should also be appreciated that at this stage of the manufacturing process, the nanowire core has a generally square or rectangular cross-sectional area. Also, at this stage, the nanowire core is supported by the underlying BOX layer and it is not suspended yet. Also, at operation 906, the nanowire core is released from the BOX layer (i.e., a recess is formed in the BOX layer under the nanowire core) such that the nanowire core is now suspended in mid-air between the source and drain regions of the FeFET device. In certain embodiments, as described above, after the nanowire core is released from the BOX layer, the nanowire core may be further processed to change the cross-sectional shape from a square shape to a circular (or generally circular) shape with annealing and/or oxidation (or any other suitable material removal process). At operation 908, a metal electrode is formed to coat the nanowire core. At operation 910, an isolator oxide layer is formed on at least a portion of the pads of the nanowire layer in the source and drain regions of the FeFET. At operation 912, a ferroelectric oxide layer is formed to coat the metal electrode. At operation 914, an interfacial layer is formed to coat the ferroelectric oxide layer. Thus, the interfacial layer is formed in the general shape of a cylindrical shell, and it is formed at a greater distance from the central axis of the nanowire core than other of the layers discussed above. Thus, the magnitude of the electrical field on the interfacial layer may be reduced relative to other of the layers because of the greater radius of this layer (see discussion of Gauss' law above). At operation 916, source and drain electrodes are formed. It should be appreciated that in other embodiments, the operations may not be in the same order as described above with respect to FIG. 9, and/or additional intermediate operations may also be included.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A ferroelectric field effect transistor (FeFET) comprising:
    a buried oxide (BOX) layer;
    a nanowire layer including
        pads formed on the BOX layer at source and drain regions of the FeFET, and
        a nanowire core extending between the pads and over a recess formed in the BOX layer;
    a metal electrode coating the nanowire core;
    a ferroelectric layer coating the metal electrode;
    an interfacial layer coating the ferroelectric layer; and
    a polysilicon layer formed over a channel region of the FeFET, the polysilicon layer coating the interfacial layer.

2. The FeFET according to claim 1, wherein a cross-sectional shape of the nanowire core is circular.

3. The FeFET according to claim 1, further comprising:
an insulator oxide layer formed in the source and drain regions of the FeFET that is configured to separate active regions of the FeFET,
wherein the polysilicon layer is also formed over at least portions of the insulator oxide layer.

4. The FeFET according to claim 3, wherein the insulator oxide layer comprises at least one selected from the group consisting of silicon dioxide ($SiO_2$), silicon oxynitride (SiON), hafnium oxide ($HfO_2$), and any other suitable high-κ dielectric material.

5. The FeFET according to claim 1, wherein the nanowire layer comprises at least one of Si or silicide.

6. The FeFET according to claim 1, wherein the ferroelectric oxide layer comprises $HfO_2$ based ferroelectrics.

7. The FeFET according to claim 6, wherein the ferroelectric oxide layer has a thickness ranging from 1 nm to 30 nm.

8. The FeFET according to claim 1, wherein the interfacial layer comprises at least one selected from the group consisting of $SiO_2$, SiON and SiN.

9. The FeFET according to claim 1, wherein the interfacial layer has a cylindrical shell shape.

10. The FeFET according to claim 1, wherein the interfacial layer has a thickness ranging from 1 nm to 5 nm.

11. A method of fabricating a ferroelectric field effect transistor (FeFET) comprising:
forming a buried oxide (BOX) layer;
forming a nanowire layer on the BOX layer, the nanowire layer including
pads formed on the BOX layer at source and drain regions of the FeFET, and
a nanowire core extending between the pads;
undercutting the BOX layer beneath the nanowire core to release the nanowire core from the BOX layer;
forming a metal electrode around the nanowire core;
forming a ferroelectric layer around the metal electrode;
forming an interfacial layer around the ferroelectric layer; and
forming a poly silicon layer over a channel region of the FeFET, the poly silicon layer coating the interfacial layer.

12. The method of fabricating a FeFET according to claim 11, further comprising subjecting the nanowire core to at least one of an annealing process and an oxidation process to change a shape of the nanowire core to a cylindrical shape.

13. The method of fabricating a FeFET according to claim 11, further comprising:
forming an insulator oxide layer formed in the source and drain regions of the FeFET that is configured to separate active regions of the FeFET,
wherein the polysilicon layer is also formed over at least portions of the insulator oxide layer.

14. The method of fabricating a FeFET according to claim 13, wherein the insulator oxide layer comprises at least one selected from the group consisting of silicon dioxide ($SiO_2$), silicon oxynitride (SiON), hafnium oxide ($HfO_2$), and any other suitable high-κ dielectric material.

15. The method of fabricating a FeFET according to claim 11, wherein the nanowire layer comprises at least one of Si or silicide.

16. The method of fabricating a FeFET according to claim 11, wherein the ferroelectric oxide layer comprises $HfO_2$ based ferroelectrics.

17. The method of fabricating a FeFET according to claim 16, wherein the ferroelectric oxide layer has a thickness ranging from 1 nm to 30 nm.

18. The method of fabricating a FeFET according to claim 11, wherein the interfacial layer comprises at least one selected from the group consisting of $SiO_2$, SiON and SiN.

19. The method of fabricating a FeFET according to claim 11, wherein the interfacial layer has a cylindrical shell shape.

20. The method of fabricating a FeFET according to claim 11, wherein the interfacial layer has a thickness ranging from 1 nm to 5 nm.

* * * * *